United States Patent [19]

Ahrens

[11] 4,239,387
[45] Dec. 16, 1980

[54] COMPACT TRANSPORT APPARATUS ESPECIALLY FOR REMOVAL OF MATERIAL BY ULTRASONIC ASSIST

[75] Inventor: James M. Ahrens, Hockessin, Del.

[73] Assignee: E. I. Du Pont de Nemours and Company, Wilmington, Del.

[21] Appl. No.: 24,799

[22] Filed: Mar. 28, 1979

[51] Int. Cl.³ .................... G03B 27/30; G03D 17/00
[52] U.S. Cl. ..................................... 355/100; 354/315
[58] Field of Search ................. 355/100; 354/83, 297, 354/298, 315, 325, 326, 327, 307

[56] References Cited

U.S. PATENT DOCUMENTS

| | | | |
|---|---|---|---|
| 1,451,065 | 4/1923 | Dye | 354/315 X |
| 3,751,164 | 8/1973 | Miller et al. | 355/100 |
| 4,161,356 | 7/1979 | Giffin et al. | 354/325 X |

FOREIGN PATENT DOCUMENTS

| | | | |
|---|---|---|---|
| 468189 | 11/1928 | Fed. Rep. of Germany | 354/307 |
| 25171 | 10/1914 | Norway | 354/315 |

Primary Examiner—Donald A. Griffin

[57] ABSTRACT

A compact transport apparatus is provided for serially conveying a series of objects such as circuit boards through a zone of treatment such as for ultrasonic stripping of resist from the circuit boards. The apparatus is mounted to the treatment equipment and has receptacles for receiving the objects and holding them in closely spaced relationship during transport through the zone and an elevator for lifting the object from its receptacle after having crossed the zone and control mechanism for intermittently stopping and starting the transport. During the stopping, loading of an object into a receptacle can occur and the elevator operates to do the aforesaid lifting.

5 Claims, 6 Drawing Figures

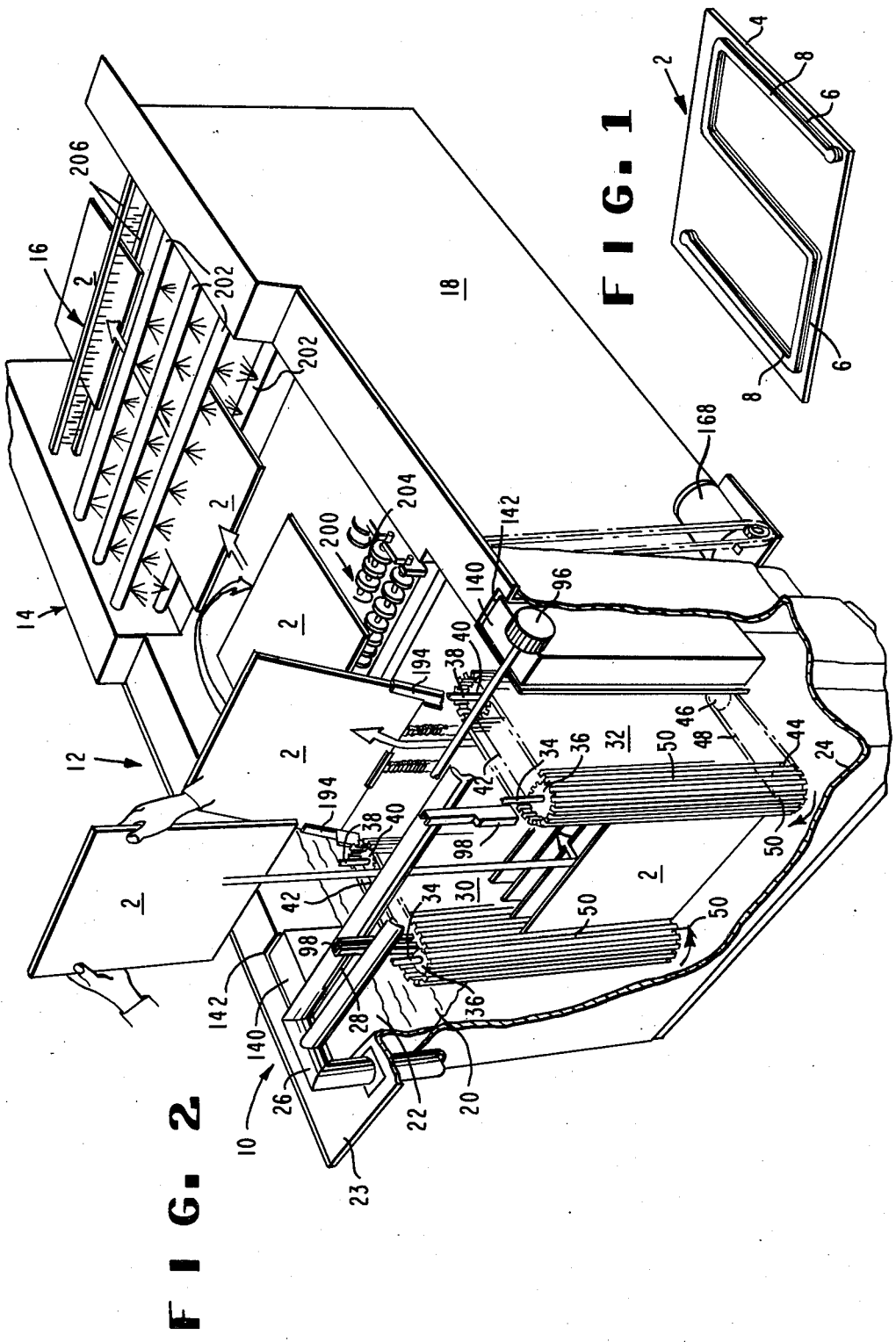

COMPACT TRANSPORT APPARATUS ESPECIALLY FOR REMOVAL OF MATERIAL BY ULTRASONIC ASSIST

TECHNICAL FIELD

This invention relates to a compact apparatus for transporting a series of objects through a treatment zone, especially for removal of material from the objects by ultrasonic assist.

BACKGROUND ART

Literature from ultrasonic equipment manufacturers advertises the equipment as being used for ultrasonic cleaning of surfaces, usually the removal of soil from the surface. Ultrasonics has also been adapted to a broad range of material removal. For example, it has been disclosed to use ultrasonics to strip a photo-hardened (exposed) resist image from a printed circuit board but no commercial use of ultrasonics for this purpose is known. Instead, stripping has been commercially carried out by solvent treatment only, to dissolve or swell the resist image and thereby remove it from the board surface.

As disclosed in U.S. Pat. No. 3,751,164, it is also known to accelerate the removal of an unexposed area of a photocurable layer to form a relief printing plate. This patent also discloses some degree of automation, involving an overhead rail system for processing the plate in a frame from operation-to-operation including ultrasonic cleaning and rinsing in separate containers. The need exists for compact transport systems in general and in particular for ultrasonic material removal, coupled with better control in critical operations such as stripping of a resist image from a printed circuit. In such stripping operation, it becomes difficult to entirely strip the resist image without stripping away some of the fine circuit lines of the printed circuit.

DISCLOSURE OF THE INVENTION

The present invention provides a compact transport system which can be described as follows: Apparatus for transporting a series of objects through a zone of treatment for said objects, comprising structure defining said zone, conveying means mounted to said structure and extending across said zone, said conveying means comprising a series of receptacles for said objects movably positioned along said conveying means in a close together relationship, means for intermittently stopping and starting the movement of said series of receptacles across said zone, means for feeding one of said objects into one of said receptacles at one side of said zone while said series of receptacles are stopped, and means for lifting one of said objects out of its respective receptacle of said series of receptacles at the opposite side of said zone while said series of receptacles are stopped.

The application of the compact transport system to ultrasonic stripping, i.e., material removal by ultrasonic assist, can be described as follows: Apparatus for ultrasonic-induced removal of material simultaneously from the faces of a succession of panels, comprising (a) a container for liquid which wets said material, (b) conveying means mounted on said container for transporting said succession of panels from one side of said container to the opposite side thereof, said conveying means including (i) means for successively receiving said panels at said one side of said container and engaging the side and bottom edges of each panel of said succession of panels to maintain said panels vertically in said liquid during said transporting, and (ii) means for moving said receiving means across said container, (c) ultrasonic-producing means positioned along the sides of said container facing the side edges of said panels for subjecting said panels to ultrasonic-induced removal of said material from the faces thereof, (d) means for controlling the movement of said receiving means including means for predetermined stopping of said movement so that each panel of said succession of panels can be fed to said receiving means at said one side of said container and means for starting said movement after each feeding of said panels to said receiving means and (e) means for lifting each panel of said succession of panels out of said receiving means and said container at said opposite side of said container during the stopping of movement of said receiving means.

The apparatus of the present invention has its own transport system for conveying panels through the ultrasonic treatment. The transport system cradles each panel during ultrasonic treatment without requiring the panel to be installed in a frame which is separate from the apparatus. The transport system can transport the panels positioned vertically through the treatment and can hold many panels in a relatively densely-packed relationship for simultaneous treatment. The system includes vertical feeding and exiting of the panels from the treatment zone so as to provide compactness to the system and to thereby enable the treatment zone to be compact thereby reducing the expenditure of power required for the treatment. The time of ultrasonic treatment is controllable and reproducible in duration.

Ultrasonic treatment of the panels from the edge direction enables a relatively large number of panels to be so-treated simultaneously. Even though the ultrasonic treatment is applied from the side edges of the panels, the desired removal of material by ultrasonically-induced cavitation occurs uniformly over the entire face of the panels without the panels themselves being attacked. Thus, the apparatus of the present invention is especially useful for stripping resist image from a printed circuit board without having the ultrasonic treatment remove or damage a portion of the printed circuit itself.

BRIEF DESCRIPTION OF THE DRAWINGS

FIG. 1 shows diagrammatically and in perspective one embodiment of panel which can be treated by apparatus of the present invention;

FIG. 2 shows diagrammatically and in perspective one embodiment of apparatus of the present invention, with portions cut-away;

DETAILED DESCRIPTION OF INVENTION AND BEST MODE

Figure 3:
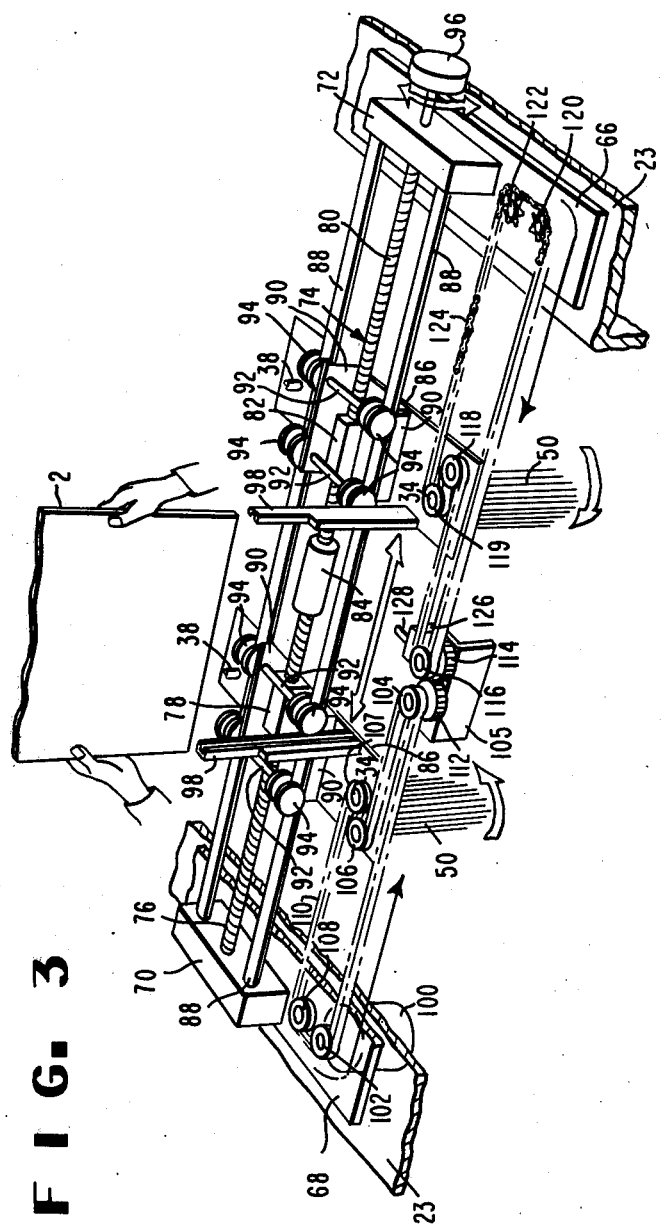
FIG. 3 shows diagrammatically and in perspective the conveyer spacing and drive assembly of the embodiment of FIG. 2.

The present invention will be described with reference to treatment of panels by ultrasonics. It will be recognized, however, that other objects can be subjected to other treatments using apparatus of the present invention.

The panels to be ultrasonically treated by the apparatus of the present invention are preferably substantially planar in overall configuration so as to permit some packing of the panels within the apparatus, whereby a plurality, for example greater than 4 and more preferably at least 6, and even at least 12, of the panels can be ultrasonically treated at the same time. The panel may have raised areas on its faces and/or incised areas such as depressions or holes.

The embodiment of panel shown in FIG. 1 is a printed circuit board 2 consisting of an electrically insulating base 4 of glass fiber-reinforced epoxy resin, a copper circuit line 6 and resist image 8 overlying the circuit line. The printed circuit formed by the circuit line 6 is of simple design for simplicity of illustration only; the most complicated printed circuit boards can be processed by the apparatus of the present invention. The circuit line 6 is also shown in excessive thickness so that it can be seen. Normally, the circuit line would be less than 0.05 mm thick and the resist image would be less than 0.08 mm thick, and the panel itself would be less than 6.25 mm in overall thickness and have a length and/or width measurement of at least 150 mm and more often at least 254 mm.

The circuit line 6 was formerly a continuous layer of copper of the same thickness covering the entire surface of the base 4. This layer of copper was etched away except for the circuit line 6 underlying the resist image 8 which protected the circuit line from being etched away by the etching solution. The same or different printed circuit can be present on the opposite face of the base 4. Alternatively, the resist image could be present on the base 4 in all areas except the circuit line, which could have been plated with etch-resistant metal to possibly form a mushroom-shaped (cross-section) conductor line extending somewhat over the resist image.

Apparatus of the present invention can be used to strip the resist image from the panel. In the case of the board 2, this would reveal the circuit line 6 of the circuit. In the alternative embodiment this would reveal the unplated copper cladding on the base 4, which could be etched away to leave the plated circuit line remaining on the base 4. Apparatus of the present invention is especially effective for removing the resist image underlying the mushroom shape of the plating quickly and without harming the circuit line.

FIG. 2 depicts such an apparatus consisting of an ultrasonic treatment section 10, a conveyer section 12, a rinsing section 14, and a drying section 16, all contained within a single housing 18.

In the ultrasonic treatment section of the housing is a container in the form of an open top tank 22 for liquid 20 which wets the resist image 8. The tank 22 has an apron 23 around its top. The outer surface of the tank is covered with a heating blanket 24, and an exhaust manifold 26 having slot-like openings 28 extending across the open top of the tank 22 is provided. The tank 22 can be considered the structure defining the ultrasonic treatment zone in the embodiment of FIG. 2.

The means for conveying the printed circuit boards 2 through the liquid 20 from the near side of the tank 22 to the opposite (far) side thereof comprises a pair of conveyer assemblies 30 and 32 dipping into the liquid 20 in the tank but not reaching the bottom of the tank. Each assembly consists of a driving shaft 34 having an upper sprocket 36 mounted thereon, a driven shaft 38 having an upper sprocket 40 mounted thereon, and a drive chain 42 operatively interconnecting the two upper sprockets. The drive and driven shafts 34 and 38, respectively, extend to the bottom of the conveyer assemblies and are operatively interconnected at their bottoms by sprockets 44 and 46 and a drive chain 48 (only one set shown and in phantom lines) in the same manner as at the top of the shafts.

Figure 4:
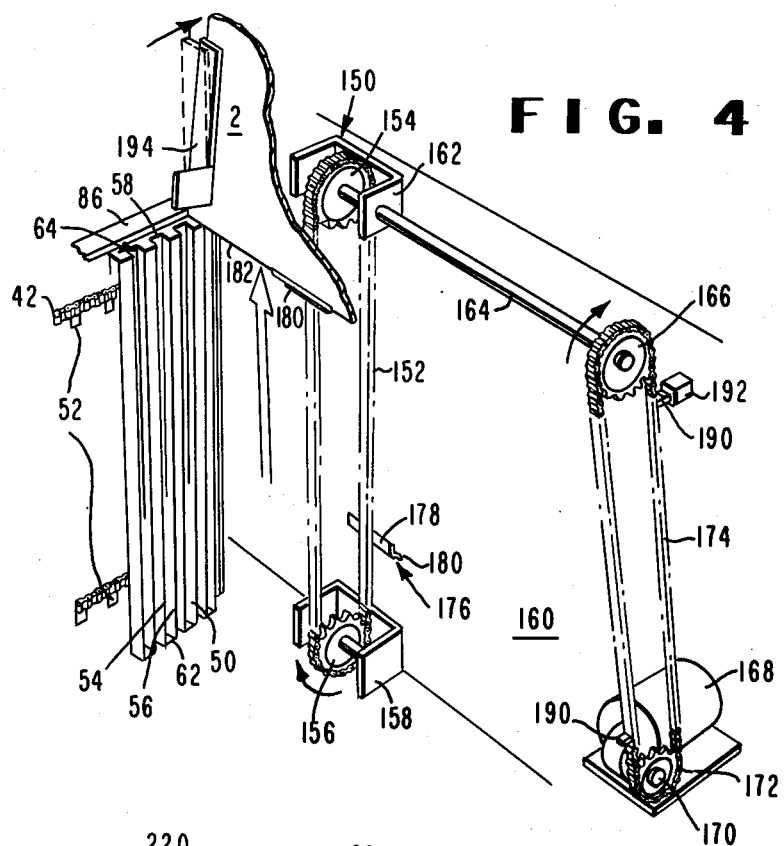
FIG. 4 shows diagrammatically and in perspective the panel removal drive assembly of the apparatus of FIG. 2.

A series of carrier channels 50 as receptacles for the boards 2 are mounted by riveting to attachment links 52 (FIG. 4) positioned along the driving chains 42 and 48 whereby each carrier channel is mounted at its top and bottom to a driving chain. As best shown in FIG. 4 each carrier channel consists of a sheet metal strip folded into a U-shaped cross-section of sidewalls 54 and 56 and base 58. The bottom of the base 58 is folded towards the sidewalls 54 and 56 to form a shelf 62. The open side of the channels of the carrier channels 50 face away from the driving chains, whereby the open sides face each other for the conveyer assemblies 30 and 32 over the path of travel to the far side of the tank 22. The channels are also open at the top of the carrier channels 50 as shown by lead line 64. In the embodiment shown, each conveyor assembly has 12 carrier channels positioned along the aforesaid path of travel, whereby 12 panels can be simultaneously processed.

FIG. 3 shows the spacing and drive assembly for the conveyor assemblies 30 and 32. The spacing assembly comprises a pair of base plates 66 and 68 mounted to the apron 23 of tank 22 by bolts (not shown). Mounted to the base plates are blocks 70 and 72. A screw thread 74 is rotatably mounted within and extends between the blocks 70 and 72. The screw thread has a left screw thread length 76 in threaded engagement with block 78 and a right screw thread length 80 in threaded engagement with block 82. These screw lengths are secured end-to-end by coupler 84. Each block 78 and 82 is mounted to a plate 86 and each plate 86 is part of a truck assembly consisting of a pair of support rods 88 extending from block 70 to block 72, truck sidewalls 90 mounted to plates 86, shafts 92 rotatably mounted to the sidewalls 90, and grooved rollers 94 riding on the rods 88. A width adjusting knob 96 is mounted to one end of the right screw thread length 80 and rotatably mounted within block 72. Also mounted to plates 86 is a pair of panel-loading guides 98 which have channels facing each other as shown in FIG. 3.

The drive assembly comprises a motor 100 mounted to plate 68, but positioned underneath apron 23, a drive sprocket 102 connected to the shaft of the motor, a guide sprocket 104 rotatably mounted to bracket 105 mounted to the near side of tank 22 (mounting not shown), a pair of sprockets 106 and 107 rotatably mounted to plate 86, and a tensioning sprocket 108. A drive chain 110 is trained around these sprockets and the position of sprocket 108 is adjustable so as to keep the chain taut. A spur gear 112 is connected to the guide sprocket 104 to rotate therewith, and this spur gear engages with spur gear 114 which is connected to driving sprocket 116 rotatably mounted to bracket 105. As above, a pair of adjacent sprockets 118 and 119 rotatably mounted to the other plate 86 and a guide sprocket 120 and tensioning sprocket 122 are rotatably mounted to plate 66 and drive chain 124 is provided and trained about these sprockets. Sprocket 107 is mounted to the top of shaft 34 of conveyer assembly 30 and sprocket 119 is mounted to the top of shaft 34 of assembly 32.

Also mounted to bracket 105 is a solenoid 126 which has a retractable arm 128 extending in the path of a printed circuit board 2 loaded into guides 98.

In operation, the spacing between the conveyer assemblies 30 and 32 is adjusted by rotation of width adjusting knob 96. This causes blocks 78 and 82 and the plates 86 to which they are mounted to move in opposite directions, depending on the direction of rotation of the knob 96. This movement of plates 86 adjusts the distance between guides 98 and carrier channels 50 of the conveyer assemblies until this distance permits printed circuit board 2 to be inserted into guides 98. The "double-back" arrangement of pairs of sprockets 106 and 118 keeps the path length of chains 110 and 124, respectively, constant during this change of spacing. Guides 98 are the same distance apart as a pair of carrier channels 50 facing each other from conveyer assemblies 30 and 32. The shafts 34 and 38 of each conveyer assembly extend through their respective plates 86 which thereby hold these shafts at a fixed distance apart for each conveyer assembly. Similar plates (not shown) are present at the bottom of each conveyer assembly for this same purpose, and these plates of each conveyer assembly are interconnected by vertical struts (not shown). This keeps the carrier channels parallel to one another from assembly 30 to assembly 32.

After adjustment to the desired spacing between conveyer assemblies is obtained, the drive assembly is then ready to be operated. Operation of drive motor 100 causes chain 110 to move and rotate sprocket 107 and thereby rotate shaft 34 to advance the carrier channels of conveyer assembly 30 in the direction shown in the drawings. Spur gears 112 and 114 communicate the movement of chain 110 to chain 124 which in turn rotates sprocket 119 and thereby rotates shaft 34 to cause the carrier channels of conveyer assembly 32 to advance in the same direction as shown in the drawings. This advancement occurs by the rotation of sprockets 107 and 119 causing drive chains 42 to move the carrier channels of each conveyer assembly across the tank. The sprockets 36 and 40 move as idler sprockets to rotate shafts 38 of each conveyor assembly. The rotation of shafts 34 and 38 also rotate bottom sprockets 44 and 46, and thereby chains 48 of each assembly 30 and 32, whereby the top and bottom of the carrier channels, rigidly held by their respective chains, travel at the same speed.

A printed circuit board is placed in load guides 98 resting on the extended arm 128 of solenoid 126. When a carrier channel 50 of each assembly 30 and 32 is in-line with the load guides 98 and the carrier channels are not advancing, i.e., the apparatus is undergoing a dwell time, the arm 128 of solenoid 126 is retracted to permit the printed circuit board 2, by gravity, to slide down and into the in-line carrier channels 50 until stopped by shelf 62 of each carrier channel. In this position, the printed circuit board 2 is immersed in liquid 20.

After release of the printed circuit board 2 by the arm 128, the arm resumes its extended position to stop the gravity fall of the next printed circuit board 2 loaded into guides 98, and motor 100 can be operated to cause the carrier channels of conveyer assemblies 30 and 32 to advance to the next carrier channel 50 of each conveyer assembly to the in-line position with the guides 98 and then stop whereupon a second printed circuit board 2 is loaded into the carrier channels. This sequence of operations is continued to load up successive carrier channels with printed circuit boards 2 as the succession of channels advance in start-stop (intermittent) manner toward the far end of the tank 22 as shown in FIG. 2. The spacing between carrier channels 50 along their respective drive chains 42 and 48 maintains the boards 2 closely spaced from each other, e.g., from 15 to 35 mm apart, but spaced sufficiently apart for exposure of the boards to the ultrasonic treatment. The boards 2 are positioned rigidly and substantially vertically and parallel to each other during this advancement and are uniformly spaced from each other, to make the ultrasonic treatment of the boards substantially uniform. The close spacing of the boards together with the gravity feed described above and elevator removal of panels described later herein, provides the advantages of compactness of the transport apparatus and this enables the treatment zone to be compact as well.

The ultrasonic treatment is obtained from ultrasonic transducers 140 mounted at opposite sides of the tank 22 facing the edges of the circuit boards 2 immersed in liquid 20 in the tank. The transducers are mounted within vertical recesses 142 in the sides of tank 22 rather than in protruding relationship from the sides of the tank. This together with the compactness of the treatment zone minimizes the amount of liquid in the tank which may require heating by heating blanket 24. The transducers are operated continuously. The transducers are also located along a final portion, e.g., about the last one-half, of the path of travel of the panels across the tank. Thus, along this portion of the path, the greatest amount of ultrasonic energy is present. This provides for efficient use of the ultrasonic energy because during travel along the earlier portion of the path, the liquid in the tank can soak and penetrate the material to be removed by the ultrasonic treatment. Until this has occurred, the ultrasonic treatment to remove the material is not very efficient.

When each printed circuit board 2 of the succession of circuit boards being simultaneously treated in the tank reaches the far end of the tank, the circuit board is automatically removed from its respective carrier channels and thus from the tank 22. This can be accomplished by an elevator assembly 150 shown in FIG. 4 positioned at the end of the path of advancement of the carrier channels. The assembly 150 comprises an elevator chain 152 trained around an upper driving sprocket 154 and a lower driven sprocket 156 immersed in the liquid in the tank. Sprocket 156 is rotatably mounted to a U-shaped bracket 158 secured to the tank wall 160. Sprocket 154 is rotatably mounted to a U-shaped bracket 162 also mounted to wall 160 and the shaft 164 to which sprocket 154 is mounted extends the outside of the tank through a hole (not shown) in the sidewall of the tank. As the shaft 164 passes through the tank sidewall, it is supported by a bearing block (not shown). The portion of the shaft 164 extending outside of the tank has a sprocket 166 mounted thereon. Positioned at the bottom of the apparatus is a motor 168 having a shaft 170 and sprocket 172 mounted on the shaft. A drive chain 174 is trained around sprockets 166 and 172. The length of chain 174 is the same as the length of chain 152. Attached to chain 152 are two lifting paddles 176 equally spaced from each other and consisting of a back portion 178 attached to the chain and a step portion 180 for receiving the bottom edge 182 of printed circuit board 2.

In operation, rotation of sprocket 172 by motor 168 causes the chain 152 to travel clockwise as seen in FIG. 4, whereby a lifting paddle engages the bottom edge of the board 2 and lifts it out of its respective carrier channels. Chain 152 is positioned along the centerline of the tank 22 and remains midway between conveyer assemblies 30 and 32 regardless of the spacing between them. In this way, only a single paddle 176 is needed to lift the board out of the carrier channels.

Motor 168 is actuated in response to the dwell time of the apparatus occurring when a printed circuit board is being loaded into a carrier channel at the near end of the tank 22. The chain 152 moves enough during the dwell time to remove the board from its carrier channels. The removal of the board from its carrier channels occurs entirely during the dwell time for the conveyer assemblies and the conveyer assemblies will not commence operation until motor 170 stops.

The control for stopping the movement of motor 168 and thus chain 152 is a pair of actuator arms 190 adjustably positioned along chain 174 and micro switch 192 mounted to housing 18 to be activated by an arm 190 as the chain 174 travels past the switch. The spacing of the arms 190 along the chain 174 is such that after the board is removed from the carrier channels, an arm 190 activates the switch 192 which stops the operation of motor 168 until the beginning of the next dwell time of the apparatus.

Mechanism is provided above the carrier channels being emptied by the board-removal mechanism just described, for receiving and directing the ultrasonically treated board to the next operation. In the embodiment shown in FIGS. 2 and 4, this comprises a pair of channel guides 194 positioned in-line with the aforesaid channel guides so that the lifting paddle 176 lifts the board 2 from the carrier channels below directly into the channel guides. The channel guides are each pivotally mounted to a plate 86 and have a rest position slightly inclined toward the conveyer section 12 of the apparatus. As the board 2 enters the channel guides, the guides pivot to a more upright position and as the board 2 clears the top of the carrier channels, the tendency of the guides to return to their rest position pivots the guides toward conveyer section 12, and the weight of the board 2 causes the guides to pivot all the way to deposit the board 2 onto the horizontal conveyer sections. As such, the panels are automatically rotated 90° from the vertical position of ultrasonic treatment to the horizontal position for subsequent treatments. The channel guides 194 are biased such as by a counterweight (not shown) to return to their rest position.

In the embodiment shown in FIG. 2, the stripped board 2 is deposited on driven rolls of a disc conveyer 200 by the pivoting channel guides 194. The disc conveyer conveys the board away from the tank 22 and out of the channel guides and between upper and lower spray manifolds 202 which rinse the stripped board generally with water. The wheels 204 of the disc conveyer 200 are staggered from row to row to permit the entire undersurface of the board to be rinsed completely. Next, the conveyer 200 passes the rinsed board between a pair of air jet manifolds 206, the air jets acting as an air knife on the board to prevent passage of the rinse liquid with passage of the board between the manifolds, thereby drying the board. The dried printed circuit board is then ready for the next operation. A hood (cover) can be provided over the apparatus so that the board will remain wet during passage from section 10 to section 14, whereby oxidation of the board surface will not occur.

Figure 5:
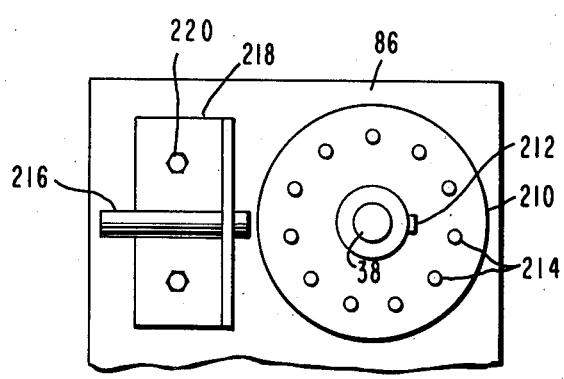
FIG. 5 shows in plan view a control device for periodically stopping operation of the apparatus of the present invention.
Figure 6:
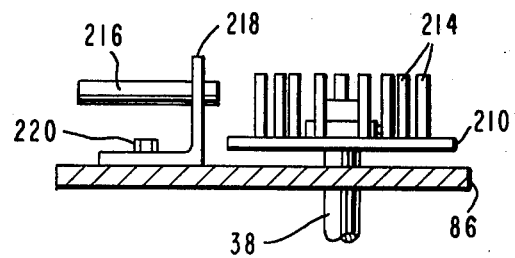
FIG. 6 shows in side elevation the control device of FIG. 5.

A preferred means for controlling operation of apparatus of the present invention involves a control device for stopping the advancement of the carrier channels when the desired pair of such channels of assemblies 30 and 32 are in-line with loading guides 98 and a solid state programmer controller for initiating operations during the resultant dwell time and for starting the advancement of the carrier channels again. FIGS. 5 and 6 show an embodiment of control device, in which a wheel 210 is mounted on the top end of shaft 38 extending above plate 86 of conveyer assembly 30 by bolt 212. A plurality of upstanding metal pins 214 are mounted in equal spacing around the circumference of the wheel. The positions of each pin 214 corresponds to a carrier channel 50 of assembly 30, and thereby a carrier channel 50 of assembly 32. As shaft 38 rotates, advancing carrier channels across the tank, the wheel 210 rotates.

A proximity sensor 216 is positioned in a bracket 218 mounted to plate 86 by bolts 220, emitting a low frequency sound wave in the direction of shaft 38. When a pin 214 passes in front of the sensor as shown in FIGS. 5 and 6, the sound wave is interrupted. A solid state switch (triac) within the sensor responds to this interruption by sending a signal to the programmer controller which, in turn, halts the power to the motor 100, thereby stopping the advancement of the carrier channels. The position of the pin 214 causing this stopping of the advancement is preset to correspond to a carrier channel 50 of each conveyer assembly to be in-line with loading guides 98. Pins can be removed from the plate if it is desired to skip loading of some of the carrier channels or the programmable controller can be programmed to bypass one or more of the pins before stopping the delivery of power to motor 100.

The aforesaid solid state programmable controller includes a timer which is set to determine the dwell time, typically 5 to 15 seconds and reconnects the power supply to motor 100 to restart advancement of the carrier channels at the end of the dwell time. At the start of this dwell time the controller simultaneously signals the solenoid arm 128 to retract, thereby allowing the board 2 in loading guides 98 to fall into the in-line carrier channels, and connects the power supply to motor 168 to cause the operation of the elevator assembly. As such, the loading and unloading of the boards with respect to the carrier channels are responsive to the stopping of the movement of the carrier channels.

A sensor can be provided to sense the dropping of a panel from arm 128 into its respective carrier channels and the proper seating of the panel therein. This sensor can be electrically connected into the control circuit to cause solenoid arm 128 to extend, thereby preventing another panel to be dropped into the same carrier channels and to permit motor 100 to restart advancement if no jam-up of panels is present.

From the foregoing description of ultrasonic treatment apparatus 10, it can be seen that the time of immersion of the board in the liquid is fixed by the time of automatic release of the board by solenoid arm 128, the rate of passage of the carrier channels through the liquid (and path length) and, the automatic removal of the board from the liquid. The residence time of the board in the liquid can be adjusted, e.g., by adjustment of the length of the dwell time and the time of advancement, generally about one second from carrier channel to carrier channel, and the extent of advancement between dwell times. The temperature is also adjustable to give optimum stripping results in which all the resist image is removed without any adverse effect on the underlying circuitry. The compactness of the ultrasonic apparatus provides the advantages of reduced power consumption by virtue of less heating energy, e.g., heating to at least 50° C., and often to at least 80° C., and use of less ultrasonic energy because of the relatively small volume of the tank. Accordingly, only no more than about one gallon of liquid is needed to treat each one-half ft$^2$ of panel surface (42 liter/0.5 mm$^2$) and preferably no more than one gal/ft$^2$ of panel surface (42 liter/mm$^2$). The apparatus also has high productivity, e.g., capable of stripping resist from at least 120–61×61 cm circuit boards (double-sided) per hour, which is more than double the productivity of conventional conveyorized stripping using solvent alone. Thus, it is possible to process at least 50 m$^2$/hr and preferably at least 80 m$^2$/hr in the treatment zone which is only about 46 cm across the tank and having a path length of only about 30 cm.

In addition to removing resist from a circuit board, apparatus of the present invention is useful to remove other materials such as soil from panels. The liquid temperature, and transducers used will depend on the material being removed. Positioning of the transducers on the side of the tank has the effect that material removed from the objects being treated falls to the bottom of the tank where such residue does not "blind" the operation of the transducers. The desirability of the liquid to wet the material being removed speeds up the removal operation. By "wetting" is meant that the liquid at the temperature used has a low contact angle with the material, i.e., the liquid tends to spread out rather than bead-up on the surface of the material. Wettability of liquids for a particular material can generally be increased by adding an agent such as a surfactant which lowers the surface tension of the liquid.

As many widely different embodiments of this invention may be made without departing from the spirit and scope thereof, it is to be understood that this invention is not limited to the specific embodiments thereof except as defined in the appended claims.

What is claimed is:

1. Apparatus for ultrasonic-induced removal of material simultaneously from the faces of a succession of panels, comprising
    (a) a container for liquid which wets said material,
    (b) conveying means mounted on said container for transporting said succession of panels from one side of said container to the opposite side thereof, said conveying means including (i) means for successively receiving said panels at said one side of said container and engaging the side and bottom edges of each panel of said succession of panels to maintain said panels spaced apart face-to-face immersed substantially vertically in said liquid during said transporting and (ii) means for moving said receiving means across said container,
    (c) ultrasonic-producing means positioned along the sides of said container facing the side edges of said panels for subjecting said panels to ultrasonic-induced removal of said material from the faces thereof,
    (d) means for controlling the movement of said receiving means including means for predetermined stopping of said movement so that each panel of said succession of panels can be fed to said receiving means at said one side of said container and means for starting said movement after each feeding of said panels to said receiving means
    (e) means for lifting each panel of said succession of panels out of said receiving means and said container at said opposite side of said container during the stopping of movement of said receiving means.

2. The apparatus of claim 1 and additional (f) conveyer means extending from said opposite side of said container, (g) means feeding each said panel lifted by said lifting means onto said conveyer for conveying away from said opposite side of said container, and (h) means for rinsing and drying each said panel during said conveying.

3. The apparatus of claim 2 wherein said feeding means rotates said panel from the vertical to the horizontal to be deposited on said conveyor means.

4. An apparatus for transporting a series of objects through a treatment zone comprising:
    a. a structure defining the treatment zone having a feed side and a discharge side;
    b. conveyor means within the zone having a series of closely spaced open receptacles for receiving each successive object in the series and moving the objects in closely spaced relationship through the zone to the discharged side thereof;
    c. means communicating with the feed side of the zone for transferring each successive object in the series into a conveyor receptacle when the conveyor is stopped;
    d. means communicating with the discharged side of the zone for removing each successive object in the series from the conveyor receptacle in which it was passed through the zone when the conveyor is stopped and discharging it from the zone; and
    e. means for stopping the movement of the conveyor and simultaneously actuating the feed transfer means and the discharge means and further means for resuming the movement of the conveyor upon the completion of the feed transfer and discharge functions.

5. The apparatus of claim 4 in which the feed transfer means operates by gravity fall of each successive object into a conveyor receptacle.

* * * * *